(12) United States Patent
Butzmann et al.

(10) Patent No.: US 9,529,053 B2
(45) Date of Patent: Dec. 27, 2016

(54) BATTERY MANAGEMENT SYSTEM AND METHOD FOR DETERMINING THE CHARGE STATE BATTERY CELLS, BATTERY AND MOTOR VEHICLE COMPRISING A BATTERY MANAGEMENT SYSTEM

(75) Inventors: Stefan Butzmann, Beilstein (DE); Holger Fink, Stuttgart (DE)

(73) Assignees: Robert Bosch GmbH, Stuttgart (DE); Samsung SDI Co., Ltd., Yongin-si, Gyeonggi-do (KR)

( * ) Notice: Subject to any disclaimer, the term of this patent is extended or adjusted under 35 U.S.C. 154(b) by 240 days.

(21) Appl. No.: 14/233,143

(22) PCT Filed: Jul. 9, 2012

(86) PCT No.: PCT/EP2012/063343
§ 371 (c)(1),
(2), (4) Date: Apr. 24, 2014

(87) PCT Pub. No.: WO2013/010831
PCT Pub. Date: Jan. 24, 2013

(65) Prior Publication Data
US 2014/0320143 A1    Oct. 30, 2014

(30) Foreign Application Priority Data
Jul. 18, 2011 (DE) .......................... 10 2011 079 291

(51) Int. Cl.
*H02J 7/00* (2006.01)
*H02J 7/24* (2006.01)
(Continued)

(52) U.S. Cl.
CPC ....... *G01R 31/3624* (2013.01); *G01R 31/3658* (2013.01); *H01M 10/482* (2013.01);
(Continued)

(58) Field of Classification Search
CPC ............ G01R 31/3624; G01R 31/3658; H01M 10/482; H02J 7/00; H02J 7/14; H02J 7/24
(Continued)

(56) References Cited

U.S. PATENT DOCUMENTS 4,558,281 A    12/1985   Codd et al.
6,781,343 B1   8/2004   Demachi et al.
(Continued)

FOREIGN PATENT DOCUMENTS

CN    101165963 A    4/2008
CN    101557118 A    10/2009
(Continued)

OTHER PUBLICATIONS

International Search Report corresponding to PCT Application No. PCT/EP2012/063343, mailed Jan. 10, 2013 (German and English language document) (5 pages).

*Primary Examiner* — Phallaka Kik
(74) *Attorney, Agent, or Firm* — Maginot, Moore & Beck LLP

(57) ABSTRACT

A method for determining the charge state of battery cells or battery modules of a battery includes monitoring several battery cells or at least one battery module using a plurality of cell monitoring units. The respective electric current of the battery cells or battery modules is measured by the cell monitoring units, the battery current is measured, and the measured current value is transmitted to the plurality of cell monitoring units. A charge state is calculated in each of the cell monitoring units for the respective monitored battery cells, or respectively, the at least one battery module. A battery management system is configured to carry out the method for determining the charge state of the battery cells or battery modules of the battery. A battery and a motor vehicle include the battery management.

10 Claims, 4 Drawing Sheets

(51) Int. Cl.
*H02J 7/14* (2006.01)
*H01M 10/00* (2006.01)
*G01R 31/36* (2006.01)
*H01M 10/48* (2006.01)

(52) U.S. Cl.
CPC . *H02J 7/00* (2013.01); *H02J 7/14* (2013.01); *H02J 7/24* (2013.01)

(58) Field of Classification Search
USPC . 320/161, 164, 165, 136, 134, 104; 324/427
See application file for complete search history.

(56) References Cited

U.S. PATENT DOCUMENTS

| | | | | |
|---|---|---|---|---|
| 2005/0242776 | A1* | 11/2005 | Emori | B60L 11/1855 320/116 |
| 2006/0071643 | A1* | 4/2006 | Carrier | H01M 10/4257 320/132 |
| 2007/0262750 | A1* | 11/2007 | Yun | G01R 31/3675 320/132 |
| 2008/0090133 | A1* | 4/2008 | Lim | H02J 7/0016 429/50 |
| 2009/0087722 | A1* | 4/2009 | Sakabe | B60L 3/0046 429/61 |
| 2009/0130541 | A1* | 5/2009 | Emori | H02J 7/0019 429/61 |
| 2009/0198399 | A1* | 8/2009 | Kubo | B60L 11/1855 701/22 |
| 2010/0136390 | A1* | 6/2010 | Ueda | H01M 10/482 429/61 |
| 2010/0171503 | A1* | 7/2010 | Fredette | G01R 31/3624 324/428 |
| 2010/0320969 | A1* | 12/2010 | Sakakibara | H01M 2/1022 320/118 |
| 2011/0156618 | A1* | 6/2011 | Seo | H01M 10/425 318/3 |
| 2011/0184677 | A1* | 7/2011 | Tae | G01R 31/3658 702/63 |
| 2011/0204853 | A1* | 8/2011 | Shimayama | H01M 10/4207 320/162 |
| 2012/0013201 | A1* | 1/2012 | Pariseau | H01M 10/48 307/125 |

FOREIGN PATENT DOCUMENTS

| | | | | |
|---|---|---|---|---|
| CN | 101997322 A | | 3/2011 | |
| CN | 102056761 A | | 5/2011 | |
| CN | 102082452 A | | 6/2011 | |
| DE | 10 2009 046 567 A1 | | 5/2011 | |
| JP | 11111349 A | * | 4/1999 | ............ H01M 10/48 |
| JP | 2000270492 A | * | 9/2000 | |
| JP | 2001086656 A | * | 3/2001 | ............... H02J 7/02 |
| JP | 2001327091 A | * | 11/2001 | |
| JP | 2003199259 A | * | 7/2003 | |
| JP | 2004006414 A | * | 1/2004 | ............ H01M 10/44 |
| JP | 2005020866 A | * | 1/2005 | ............... H02J 7/02 |
| JP | 2011135656 A | * | 7/2011 | |
| JP | 2011221012 A | * | 11/2011 | |
| JP | WO 2015001703 A1 | * | 1/2015 | ............ H02J 7/0016 |

* cited by examiner

BATTERY MANAGEMENT SYSTEM AND METHOD FOR DETERMINING THE CHARGE STATE BATTERY CELLS, BATTERY AND MOTOR VEHICLE COMPRISING A BATTERY MANAGEMENT SYSTEM

This application is a 35 U.S.C. §371 National Stage Application of PCT/EP2012/063343, filed on Jul. 9, 2012, which claims the benefit of priority to Serial No. DE 10 2011 079 291.0, filed on Jul. 18, 2011 in Germany, the disclosures of which are incorporated herein by reference in their entirety.

BACKGROUND

The present disclosure relates to a method for determining the states of charge of battery cells or battery modules of a battery using a plurality of cell monitoring units, each of which monitors a plurality of the battery cells or at least one battery module. Furthermore, the disclosure relates to an associated battery management system for carrying out the method and also to a battery and a motor vehicle.

It is apparent that in future both in the case of static applications, such as wind power installations, in vehicles, such as in hybrid and electric vehicles, and in the consumer sector, such as in the case of laptops and mobile telephones, use will increasingly be made of new battery systems, on which very high demands in terms of the reliability, safety, performance and life thereof are placed.

Batteries with lithium ion technology are particularly suited to such tasks. They are distinguished by high energy density and low self-discharge, inter alia. By definition, lithium ion batteries comprise two or more lithium ion cells that are interconnected. Lithium ion cells can be interconnected by virtue of parallel or serial interconnection to form modules, and then to form batteries. Typically, a module comprises six or more cells.

DE 10 2009 046 567 A1 discloses a battery that is constructed from a plurality of battery modules, wherein the battery modules are monitored by means of a central battery management system.

In the present description, depending on the context, all of the battery cells arranged in battery modules with or without the associated battery management system can be referred to as a battery. In addition, the term cell monitoring unit can be abbreviated to CSC (cell supervision circuit), and state of charge to SOC.

The text below makes reference to FIG. 1 to describe an exemplary battery system 10 in accordance with the prior art that has a battery with battery cells 14 and also has a battery management system (BMS) 11. As indicated in FIG. 1 by a respective broken line, the battery system 10 has a battery with a large number of battery cells 14, and also has a large number of cell monitoring units 16. The battery cells 14 are grouped into battery modules, the precise split of the battery cells into the battery modules not being shown in FIG. 1. The battery management system 11 may be accommodated with battery cells 14 or battery modules in a shared housing (not shown). The battery modules may each have a separate housing. An arrangement of the battery cells 14 in battery modules can be used to achieve better scalability. In order to monitor the correct operation of the battery cells 14, the battery cells are monitored by a plurality of CSCs 16. A CSC 16 contains measuring electronics that monitor the voltage and further parameters. The information obtained by means of the CSC 16 is sent via a communication bus 35, for example a CAN bus, to a central controller 15 that evaluates the data from all battery cells 14 and, in the event of deviations from defined parameters, takes corrective action or if necessary opens the contactors 17, 18 and disconnects the battery system 10. The controller 15 is also connected to motor vehicle electronics (not shown) via the bus 28.

In order to monitor the correct operation of the battery cells 14, the battery management system 11 typically involves two respective modules being monitored by one CSC 16. In order to ensure sufficient functional safety for the battery system 10, the data from the CSCs 16 are evaluated and compared with one another both on the high voltage side 24 and on the low voltage side 22 of the controller 15 in two redundant microcontrollers 23, 25. In this case, the high-voltage-side microcontroller 25 uses the total voltage of the pack, that is to say of all battery modules, and also the total current that is measured by means of the shunt 26, for example. The low-voltage-side microcontroller 23 measures the voltage of the individual battery cells 14 and also the current that is ascertained using the Hall sensor 27, for example. Typically, the state of charge of the battery pack is also calculated on the low voltage side of the controller. To this end, the controller simultaneously checks current and voltage values for the battery cells that are relevant to the calculation of the SOC.

A disadvantage of such a battery system is that a large volume of data needs to pass via the communication lines to which the controller and the cell monitoring units are connected, which takes up increased bandwidth. This is particularly disadvantageous in the case of a motor vehicle in which a CAN bus or another bus system is used.

SUMMARY

A method for determining the states of charge (SOC) of battery cells or battery modules of a battery is provided, as specified in disclosure.

The method involves a plurality of cell monitoring units (CSC) being used, each of which monitors a plurality of the battery cells or at least one battery module. The method according to the disclosure fundamentally comprises the following steps: the respective electrical voltage of the battery cells or battery modules is measured by the cell monitoring units, a current from the battery is measured, transmission of the measured current value to the plurality of cell monitoring units, and calculation of an SOC in each of the cell monitoring units for the respective monitored battery cells or the respective at least one battery module.

An advantage of the method according to the disclosure is that the data rate that passes via the communication bus is reduced. Thus, in the case of a battery that is split into a plurality of battery modules, many of which have associated cell monitoring units, it is possible to dispense with the transmission of data that are required for calculating the states of charge in a central controller. Instead, just a single value for the measured battery current is transmitted. The method according to the disclosure advantageously makes use of the fact that, in order to determine the state of charge of individual battery modules or battery cells, it is sufficient if the globally ascertained current value is used. The voltage values continue to be ascertained locally.

Furthermore, the reduction in the data rate is achieved particularly easily in accordance with the disclosure without increased hardware involvement. In comparison with a method in which, by way of example, the current is also ascertained locally, the method according to the disclosure affords a reduction in the involvement required: thus, the disclosure involves the use of a conventional global current sensor and the current is measured globally, which also means increased safety. The disclosure can therefore involve elegant calculation of a local, battery-module-oriented SOC in the CSCs without the latter needing to have a dedicated current sensor, which would, that is to say, entail not only high costs but also a comparatively high level of involvement in the control and plausibilization.

Advantageous developments of the disclosure are specified in the subclaims and are described in the description.

Thus, in one particular embodiment, a trigger signal is transmitted to the cell monitoring units. The electrical voltages are measured in the cell monitoring units in response to the trigger signal. This particularly advantageously achieves simple synchronization of the voltage measurements.

In accordance with one advantageous development of this particular embodiment, the trigger signal is sent to the cell monitoring units by a controller of the battery management system monitoring the battery via a separate trigger line. In this case, the trigger line connects the controller to the cell monitoring units. This approach simplifies the control of the method.

In accordance with an alternative embodiment, the trigger line is dispensed with and the voltage measurements are instead performed in response to the transmission of the current value, for example.

In accordance with one preferred embodiment of the disclosure, the states of charge are ascertained by the cell monitoring units in response to the transmitted current value and are returned to the controller.

Particularly advantageously, the method is controlled by a low voltage side of the controller. This may involve the use of particularly a microcontroller that is existent in redundant form on the low voltage side, as a result of which it is possible to achieve effective division of labor in the controller and a high safety level ASIL (automotive safety integrity level).

In this case, in accordance with one embodiment, the low voltage side checks the battery current on a high voltage side of the controller, or starts an enquiry, which causes the high voltage side to output the value of the battery current.

In accordance with one embodiment, the cell monitoring units are actuated in accordance with the method via two separate communication lines. In this case, it is preferred that the two communication lines couple the low voltage side and the high voltage side of the controller separately to a respective different microcontroller in a cell monitoring unit.

In this embodiment, it is advantageously possible to use modified cell monitoring units that have redundant hardware and use a redundant topology in order to be able to communicate in parallel by means of the two separate communication lines.

In accordance with a development of this embodiment, the battery current is output to the cell monitoring units by the high voltage side via one of the two communication lines.

Alternatively, the high voltage side notifies the low voltage side of the current value, and the low voltage side then transmits the current value.

In accordance with one preferred embodiment of the disclosure, the battery current is ascertained by means of a shunt by a microcontroller arranged on the high voltage side of the controller.

The disclosure also provides a battery management system that has a controller, at least one current sensor and a plurality of cell monitoring units, wherein the battery management system is set up to carry out the method as claimed in one of the preceding claims.

Furthermore, a battery having the battery management system according to the disclosure is provided, and a motor vehicle having the battery management system according to the disclosure, wherein the battery to be monitored is connected to a drivetrain in the motor vehicle.

BRIEF DESCRIPTION OF THE DRAWINGS.

Exemplary embodiments of the disclosure are explained in more detail with reference to the drawings and the description below. In the drawings.

DETAILED DESCRIPTION

In the detailed description below and in the appended drawings, identical reference symbols indicate the same or similar components.

Figure 1:
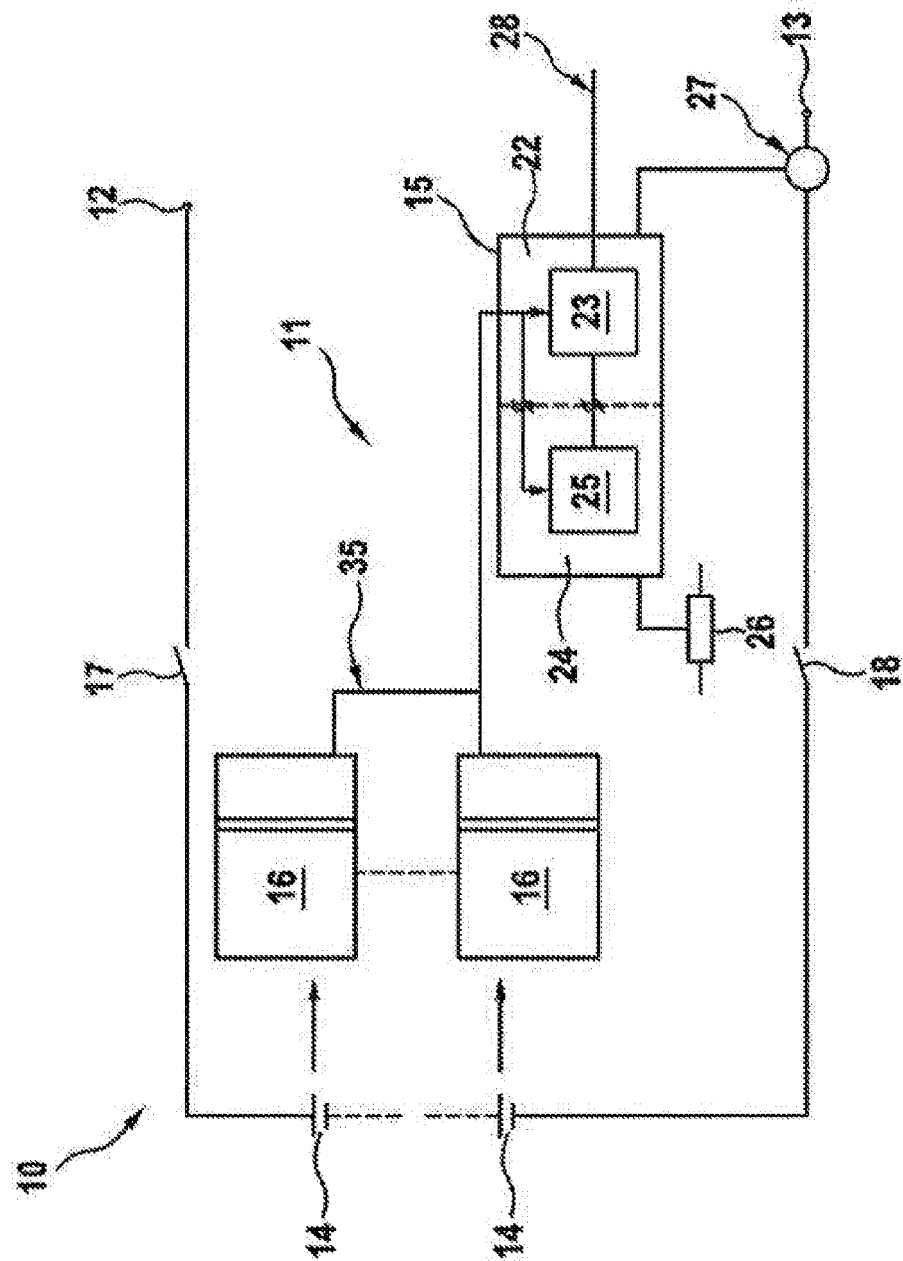
FIG. 1 shows a battery with a battery management system in accordance with the prior art.
Figure 2:
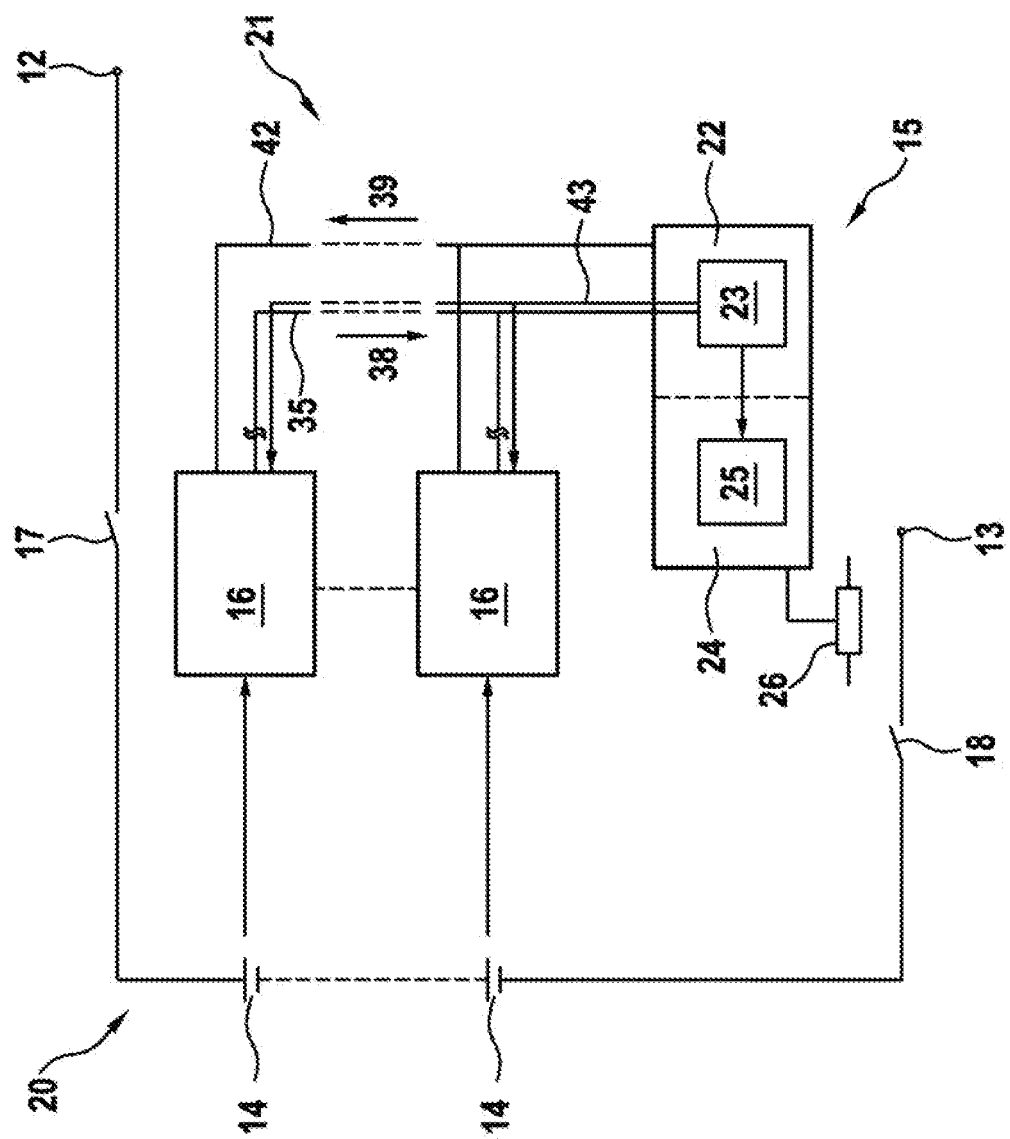
FIG. 2 shows a battery with a battery management system in accordance with an embodiment of the disclosure.

FIG. 2 shows a battery system 20 comprising a battery with a battery management system 21 in accordance with an embodiment of the disclosure.

The battery current is measured centrally by the high voltage side 24 of the controller 15. This information is transmitted to the CSCs 16 for the purpose of precise determination of the SOC 38 of the individual modules.

The battery management system 21 has appropriate means in the hardware, software and/or firmware, the electronic components and or the data links, as a result of which it is adequately customized for the method according to the disclosure. The method is intended to be controlled by the low voltage side 22 of the controller 15. The low voltage side 22 ensures that the voltage is measured in all CSCs 16 simultaneously by sending a trigger signal 39 to the CSCs 16 via the trigger line 43. Alternatively, in accordance with a variant of this embodiment, an enquiry is sent via the communication bus 35, in this case: a CAN bus.

In parallel, the low voltage side 22 checks the current on the high voltage side 24. The precise current value, which is ascertained by means of a shunt 26 by the high-voltage-side microcontroller 25, is then transmitted to the CSCs 16 via the communication bus 35. The CSCs 16 can then calculate the respective SOC and return it to the controller 15, as also indicated in FIG. 2. The battery management system 31 also has an alarm line 42 that connects the CSCs 16 to the controller 15 and can be used to output an alarm in the event of a critical value for the SOC or a voltage. In response to this alarm, corrective action is taken or a contactor 17, 18 is opened in order to disconnect the battery system 20.

Figure 3:
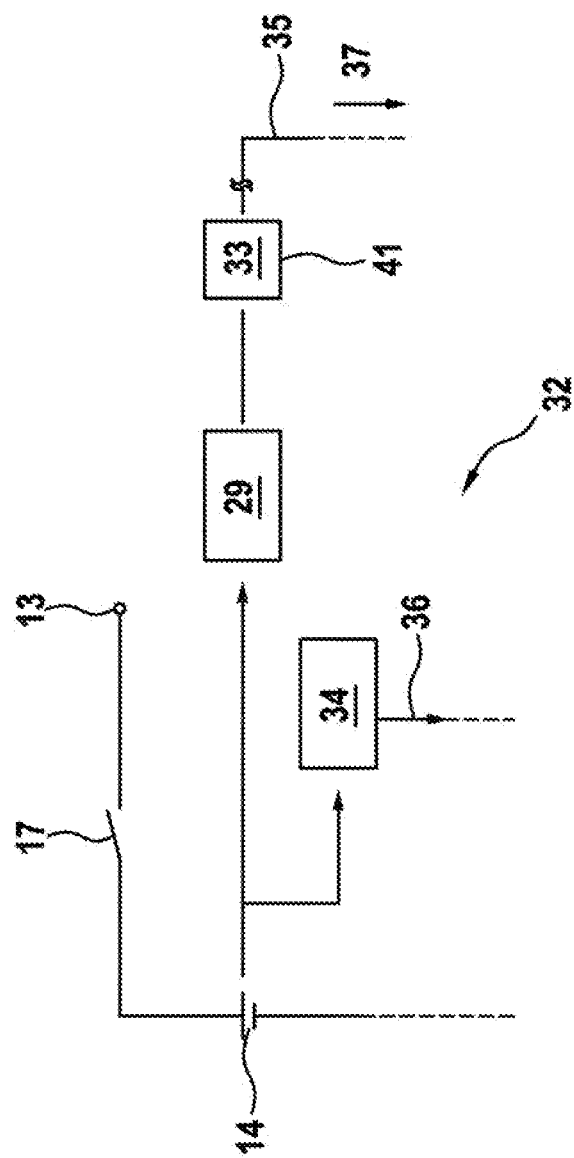
FIG. 3 shows components of a battery and of a cell monitoring unit in accordance with another embodiment of the disclosure, wherein a state of charge is ascertained in the cell monitoring unit.

FIG. 3 shows components of a battery with a CSC 32 in accordance with another embodiment of the disclosure. The CSC 32 has a microcontroller 33 in which the SOC 38 of the battery module is ascertained, as indicated by the reference symbol 41 in FIG. 3. The SOC is ascertained in response to transmission of the current value to the CSC 31. The microcontroller 33 then transmits this value to the controller. The CSC 32 is fitted with a cell voltage measuring unit 29. The cell voltage measuring unit 29 used may be a CVM (cell voltage monitor) unit. Furthermore, the CSC 32 has a second measuring unit 34, which may be in the form of a CVM or in the form of a min/max measuring unit, with the min max measuring unit merely outputting the minimum and maximum voltages in the battery module. The CSC 32 can also ascertain values for other physical variables, such as the temperature. Overall, the communication bus 35 is used to send fewer data 37 and the involvement in the controller is reduced. Thus, in accordance with the exemplary embodiment, the data 37 contain just the battery module SOC, the minimum voltage, the maximum voltage and a temperature.

Figure 4:
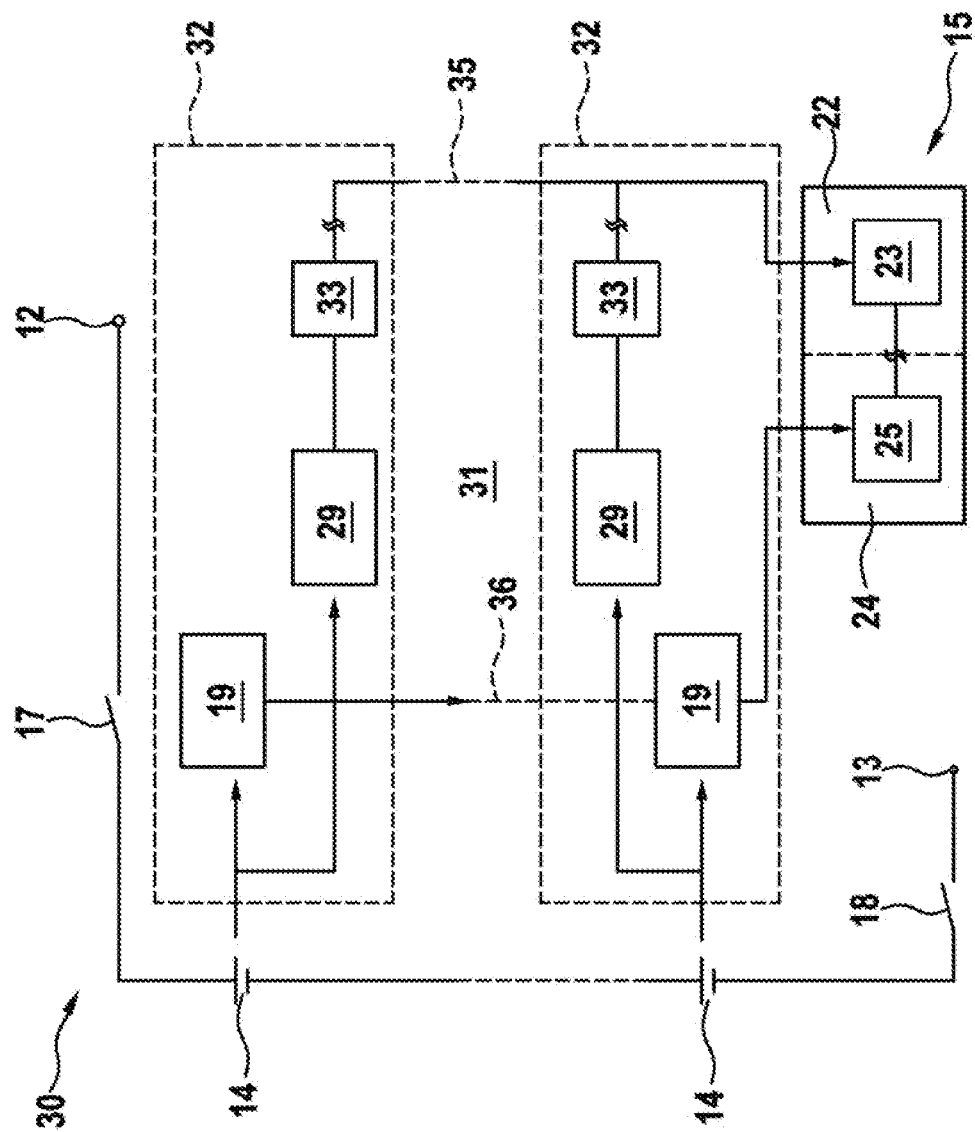
FIG. 4 shows the battery with battery management system in accordance with the embodiment shown in FIG. 3, wherein a redundant topology having two separate communication buses is shown.

FIG. 4 shows the redundant topology with two separate communication buses from the embodiment shown in FIG. 3. The measuring electronics of the battery management system 31 are of redundant design, and each CSC 31 has two CVMs 19, 29. The microcontrollers 23, 25 are actuated using two separate communication lines 35, 36, and each of the communication lines is connected to one CVM 19, 29 per CSC. The two types of CVM 19, 29 may be of identical or different design. In addition, the communication lines 35, 36 may also be of different type. By way of example, the communication line that is coupled to the high voltage side can also provide a daisychain architecture. The topology shown in FIG. 4 is preferably suited to carrying out the method according to the disclosure. First of all, the hardware redundancy can result in decreased software involvement in the controller 15. In addition, the communication lines 35, 36 can be used to actuate the components in the CSCs 31 in accordance with the method.

The invention claimed is:

1. A method for determining the states of charge of battery cells or battery modules of a battery using a plurality of cell monitoring units, the cell monitoring units each monitoring a plurality of the battery cells or at least one battery module, the method comprising:
    globally measuring a total current from the battery;
    transmitting the measurement of the total current and/or a trigger signal to the plurality of cell monitoring units;
    measuring an electrical voltage of each of the battery cells or battery modules with the respective cell monitoring units in response to the transmitted measurement of the total current or the trigger signal; and
    calculating a state of charge in each of the cell monitoring units for the respective monitored battery cells or the respective at least one battery module using the respective measured electrical voltages of the battery cells or battery modules and the measurement of the total current.

2. The method as claimed in claim 1, wherein the trigger signal is sent to the cell monitoring units by a controller of a battery management system monitoring the battery via a separate trigger line, and wherein the trigger line is connected to the controller and to the cell monitoring units.

3. The method as claimed in claim 1, wherein the states of charge are ascertained by the cell monitoring units in response to the transmitted current value and are returned to the controller.

4. The method as claimed in claim 1, wherein the method is controlled by a low voltage side of the controller.

5. The method as claimed in claim 4, wherein the low voltage side checks the battery current on a high voltage side of the controller.

6. The method as claimed in claim 1, wherein the cell monitoring units are actuated via two separate communication lines.

7. The method as claimed in claim 1, wherein the battery current is ascertained by a high-voltage-side microcontroller via a shunt.

8. A battery management system, comprising:
    a controller;
    at least one current sensor; and
    a plurality of cell monitoring units,
    wherein the battery management system is configured to carry out a method for determining the states of charge of battery cells or battery modules of a battery, the cell monitoring units each being configured to monitor a plurality of the battery cells or at least one battery module, the method including:
        globally measuring a total current from the battery;
        transmitting the measurement of the total current and/or a trigger signal to the plurality of cell monitoring units;
        measuring an electrical voltage of each of the battery cells or battery modules with the respective cell monitoring units in response to the transmitted measurement of the total current or the trigger signal; and
        calculating a state of charge in each of the cell monitoring units for the respective monitored battery cells or the respective at least one battery module using the respective measured electrical voltages of the battery cells or battery modules and the measurement of the total current.

9. The battery management system as claimed in claim 8, wherein a battery includes the battery management system.

10. A motor vehicle, comprising:
    a battery management system including:
        a controller;
        at least one current sensor; and
        a plurality of cell monitoring units,
        wherein the battery management system is configured to carry out a method for determining the states of charge of battery cells or battery modules of a battery, the cell monitoring units each being configured to monitor a plurality of the battery cells or at least one battery module, the method including:
            globally measuring a total current from the battery;
            transmitting the measurement of the total current and/or a trigger signal to the plurality of cell monitoring units;
            measuring an electrical voltage of each of the battery cells or battery modules with the respective cell monitoring units in response to the transmitted measurement of the total current or the trigger signal; and
            calculating a state of charge in each of the cell monitoring units for the respective monitored battery cells or the respective at least one battery module using the respective measured electrical voltages of the battery cells or battery modules and the measurement of the total current,
    wherein the battery to be monitored is connected to a drivetrain in the motor vehicle.

* * * * *